(12) United States Patent
Balakrishnan et al.

(10) Patent No.: US 12,484,160 B2
(45) Date of Patent: Nov. 25, 2025

(54) TECHNOLOGIES FOR SHIELDING AN INDUCTOR ON A CIRCUIT BOARD

(71) Applicant: Intel Corporation, Santa Clara, CA (US)

(72) Inventors: Ranjul Balakrishnan, Bangalore (IN); Sandesh G. Krishnamurthy, Bengaluru (IN); Jackson C.P. Kong, Tanjung Tokong (MY)

(73) Assignee: Intel Corporation, Santa Clara, CA (US)

( * ) Notice: Subject to any disclaimer, the term of this patent is extended or adjusted under 35 U.S.C. 154(b) by 915 days.

(21) Appl. No.: 17/482,356

(22) Filed: Sep. 22, 2021

(65) Prior Publication Data

US 2022/0015246 A1 Jan. 13, 2022

(51) Int. Cl.
*H05K 1/11* (2006.01)
*H05K 1/18* (2006.01)
*H05K 3/00* (2006.01)
*H05K 3/46* (2006.01)

(52) U.S. Cl.
CPC .......... *H05K 3/4644* (2013.01); *H05K 1/115* (2013.01); *H05K 1/181* (2013.01); *H05K 3/0047* (2013.01); *H05K 2201/10128* (2013.01); *H05K 2201/10159* (2013.01)

(58) Field of Classification Search
CPC ...... H05K 3/4644; H05K 1/115; H05K 1/181; H05K 1/0298; H05K 1/0243
See application file for complete search history.

(56) References Cited

U.S. PATENT DOCUMENTS

| 10,980,117 | B1 * | 4/2021 | Maas | G06F 30/331 |
| 2008/0002382 | A1 * | 1/2008 | Howell | H05K 1/141 |
| | | | | 361/803 |
| 2012/0241207 | A1 * | 9/2012 | Huang | H05K 1/0265 |
| | | | | 174/262 |
| 2014/0083757 | A1 * | 3/2014 | Hu | H05K 3/4602 |
| | | | | 174/262 |
| 2016/0309574 | A1 * | 10/2016 | Wang | H05K 1/113 |
| 2018/0286815 | A1 * | 10/2018 | Qi | H01L 23/49822 |
| 2019/0096798 | A1 * | 3/2019 | Aleksov | H01L 23/5225 |
| 2019/0372198 | A1 * | 12/2019 | Dalmia | H01Q 1/2283 |
| 2021/0378092 | A1 * | 12/2021 | Lin | H05K 3/4602 |
| 2021/0392742 | A1 * | 12/2021 | Liou | H05K 1/0245 |

* cited by examiner

*Primary Examiner* — Sherman Ng
(74) *Attorney, Agent, or Firm* — Alliance IP, LLC

(57) ABSTRACT

Technologies for shielding an inductor on a circuit board are disclosed. In the illustrative embodiments, a circuit board has a voltage regulator on top of it and one or more signal traces routed beneath or near the voltage regulator. Partial metal vias are positioned between the signal traces and the voltage regulator. The partial metal vias extend from one trace layer of a circuit board towards another trace layer, but the partial metal vias do not connect the two trace layers. The partial metal vias partially shield the signal traces from noise caused by the voltage regulator.

13 Claims, 11 Drawing Sheets

TECHNOLOGIES FOR SHIELDING AN INDUCTOR ON A CIRCUIT BOARD

BACKGROUND

Circuit boards are ubiquitous in modern electronics. Circuit boards can connect various components, such as voltage regulators and integrated circuit components. Circuit boards can have a large number of connections in multiple layers connecting different components. In some cases, a circuit board can have a high-speed signal trace and a component such as a voltage regulator. In order to prevent or mitigate noise from the voltage regulator, the high-speed signal trace may be routed far away from the voltage regulator, such as 8-13 millimeters away from the voltage regulator.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™ and may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatuses, methods, and systems described herein are not limited to physical computing devices but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

Figure 1:
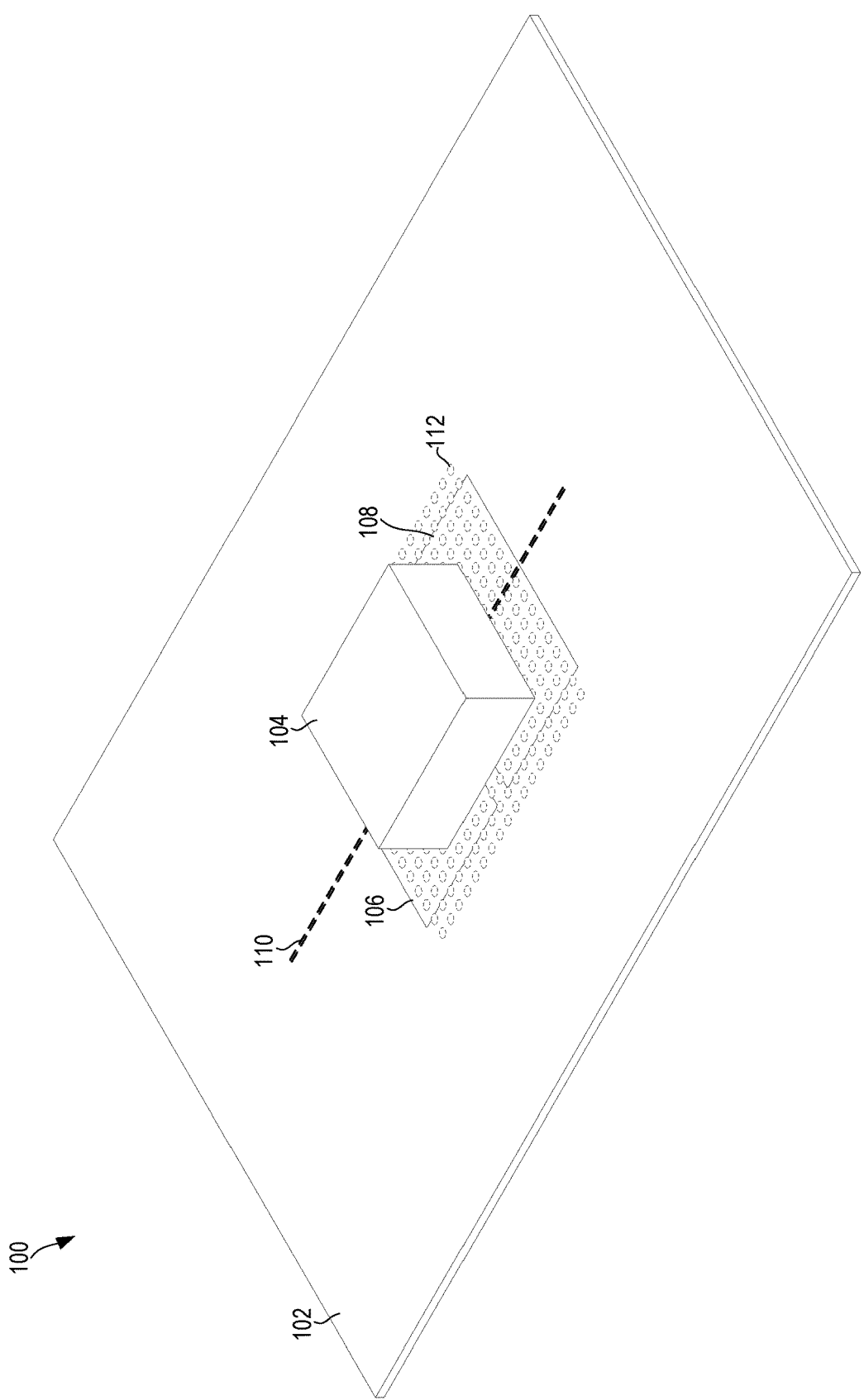
FIG. 1 is a perspective view of one embodiment of a system with a circuit board with partial metal vias.

Referring to FIG. 1, a system 100 includes a circuit board 102 and a voltage regulator 104 mounted on the top surface of the circuit board 102. The circuit board 102 has a first power connector 106 and second power connector 108 connected to the voltage regulator 104. The circuit board includes an array of partial metal vias 112 positioned between the voltage regulator 104 and one or more high-speed signal traces 110. As discussed in more detail below, the partial metal vias 112 shield the traces 110 from magnetic and/or electrical noise from the voltage regulator 104 by reducing the H field penetration.

It should be appreciated that, as used herein, the "top side," "top surface," "bottom side," etc., of the circuit board 102 as well as relative positioning terms such as "above" and "below" are arbitrary designations used for clarity and do not denote a particular required orientation for manufacture or use. Although the illustrative embodiment described has the voltage regulator 104 placed on the "top" side of the circuit board 102, in some embodiments, the voltage regulator 104 may additionally or alternatively be placed on the "bottom" side of the circuit board 104.

Figure 2:
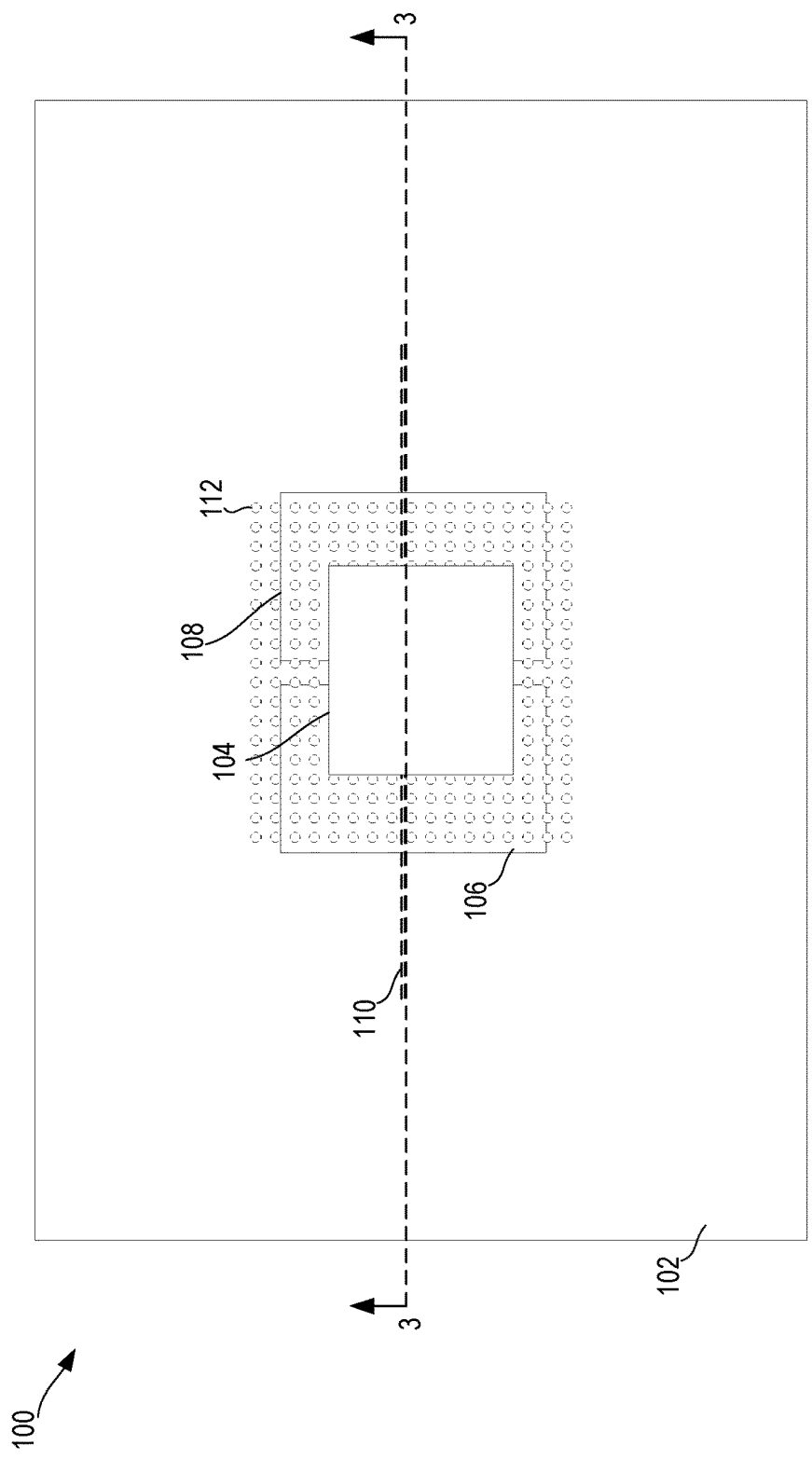
FIG. 2 is a top-down view of the system of FIG. 1.
Figure 3:
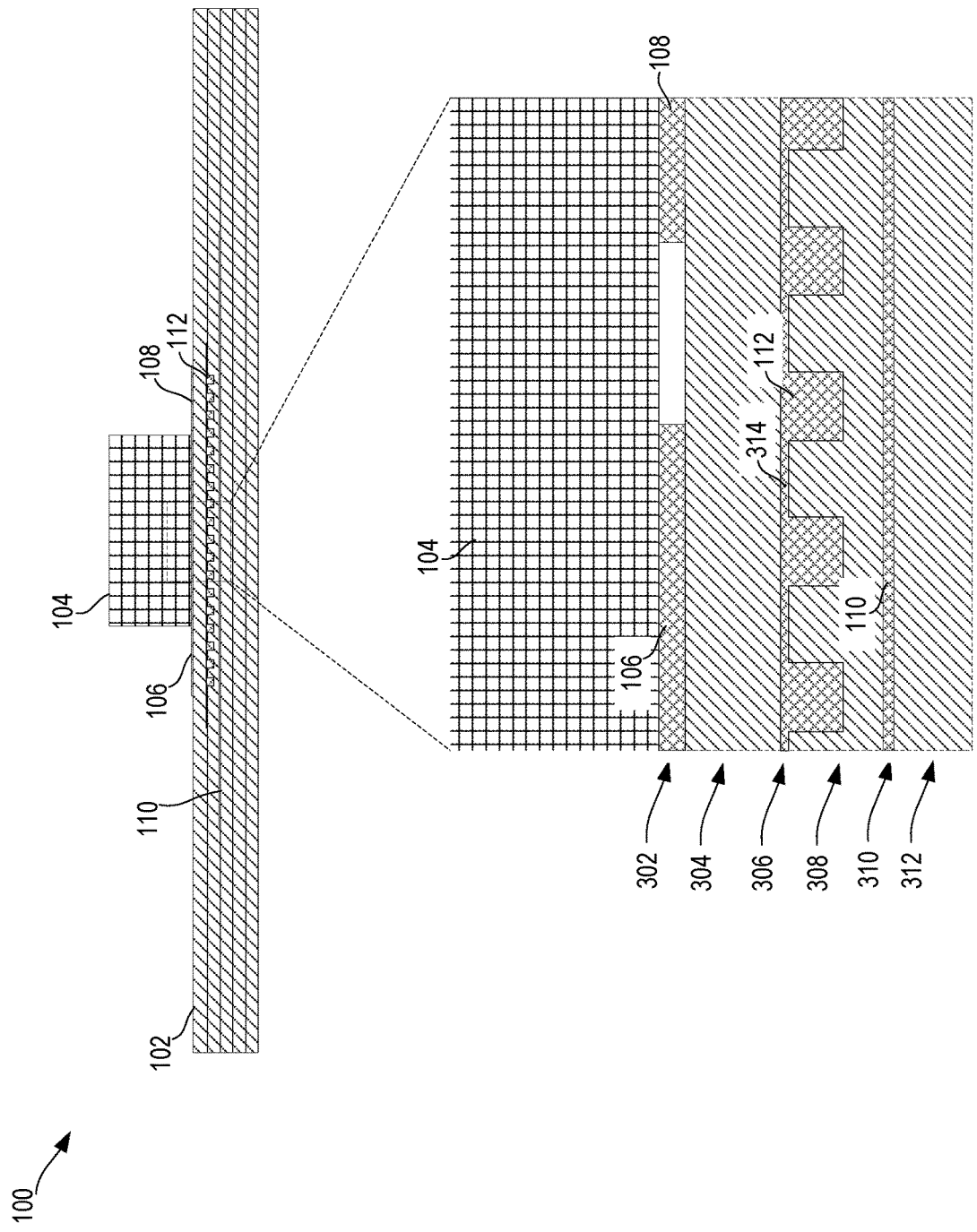
FIG. 3 is a cross-sectional view of the system of FIG. 1.

FIG. 2 shows a top-down view of the system 100, and FIG. 3 shows a cross-sectional view taken along the dashed line shown in FIG. 2. As shown in FIG. 3, the circuit board 102 includes multiple layers. Starting from the top of the circuit board 102, the circuit board 102 has a trace layer 302, a dielectric layer 304, a trace layer 306, a dielectric layer 308, a trace layer 310, and a dielectric layer 312. It should be appreciated that each trace layer 302, 306, 310 may or may not include one or more traces. In the illustrative embodiment, some (but not all) of each trace layer 302, 306, 310 has a trace present in it. However, in some places, the trace layers 302, 306, 310 may not have any traces present, and the two adjacent dielectric layers 304, 308, 312 may be in contact.

The first power connector 106 and the second power connector 108 are on the top trace layer 302. The trace layer 306 includes an array of partial metal vias 112. Each partial metal via extends partially through the dielectric layer 308 but does not extend all the way through the dielectric layer 308 to the next trace layer 310. As a result, the partial metal vias 112 do not establish connections between two adjacent trace layers (such as trace layer 306 and trace layer 310). However, the partial metal vias 112 add additional conductive material between the voltage regulator 104 and the signal trace(s) 110 in the trace layer 310, reducing the noise caused by the voltage regulator 104 on the signal trace(s) 110. As a result, the signal trace(s) 110 may be routed closer to the voltage regulator 104 than might otherwise be the case without shielding from the partial metal vias 112. In the illustrative embodiment, some or all of the partial metal vias 112 are connected by a trace 314 in the trace layer 306. In other embodiments, some or all of the partial metal vias 112 may not be connected to a trace in the trace layer 306, or different partial metal vias 112 may be connected to different traces in the trace layer 306. It should be appreciated that, as the partial metal vias 112 do not extend all the way through the dielectric layer 308, the trace 314 and/or the partial metal vias 112 may be part of a ground net that is different from a ground net in the trace layer 310 immediately below the partial metal vias 112. As the partial metal vias 112 do not create punctures on the planes in the next layers, there are no anti-via pads in the next layer to accommodate the via.

In the illustrative embodiment, the voltage regulator 104 includes an inductor with or without a magnetic core that generates a magnetic field that extends at least partially into the circuit board 102. In the illustrative embodiment, the voltage regulator 104 is part of a switch-mode voltage regulator that uses one or more power delivery inductors. Additionally or alternatively, in some embodiments, the voltage regulator 104 may include other components that may cause electrical or magnetic noise. In other embodiments, a circuit component 104 that causes electrical or magnetic noise may be a component other than a voltage regulator.

Each of the illustrative dielectric layers 304, 308, 312 is a fiberglass board made of glass fibers and a resin, such as FR-4. In other embodiments, any suitable dielectric layers may be used. The thickness of each dielectric layer 304, 308, 312 can be any suitable thickness, such as 50 to 500 micrometers. The circuit board 102 may have any suitable number of dielectric layers, such as 1-10. The total thickness of the circuit board 102 may be any suitable thickness, such as 100 micrometers to 5 millimeters. The dielectric layers 304, 308, 312 and the circuit board 102 can have any suitable length and width, such as 5-500 millimeters. Although shown as a rectangle, it should be appreciated that the circuit board 102 may be any suitable shape and may have protrusions, cutouts, etc., in order to accommodate, fit, or touch other components of a device. In the illustrative embodiment, the circuit board 102 and each dielectric layer 304, 308, 312 are planar. In other embodiments, some or all of the circuit board 102 and dielectric layers 304, 308, 312 may be non-planar.

In the illustrative embodiment, the first power connector 106 and the second power connector 108 are able to carry large amounts of current as an input to and an output from the voltage regulator 104, such as 1-100 amps. As such, the first power connector 106 and/or the second power connector 108 may have a relatively large area and/or thickness compared to other traces on the circuit board 102. For example, the first power connector 106 and/or the second power connector 108 may have a width of, e.g., 1-20 millimeters. Each trace on the circuit board may have any suitable width, such as any width from 0.05-20 millimeters. In the illustrative embodiment, signal traces such as signal trace(s) 110 may have a width of 0.1-0.15 millimeters. Each trace on the circuit board may have any suitable height, such as any height from 5 micrometers to 40 micrometers. In the illustrative embodiment, the height of each trace, such as signal trace 110, is 20-25 micrometers.

In the illustrative embodiment, each of the traces 106, 108, 110, 314 and partial metal vias 112 are made of copper. In other embodiments, some or all of the traces 106, 108, 110, 314 and/or partial metal vias 112 may be made of or include other materials, such as silver, aluminum, gold, etc. In some embodiments, some or all of the traces 106, 108, 110, 314 and/or the partial vias 112 may be made of a non-metallic conductor.

In the illustrative embodiment, there are a pair of high-speed signal traces 110, corresponding to a differential stripline that can carry high-speed signals. In other embodiments, there may be one high-speed signal trace 110 that carries a signal, and there may be a ground plane or other ground traces near the signal trace 110. As used herein, a high-speed signal trace refers to a trace that connects two or more circuit components that will transmit and/or receive a signal on the high-speed signal trace at an analog frequency of 100 megahertz or higher. High-speed signal traces 110 may be used for any suitable signal, such as a peripheral component interconnect express (PCIe) interconnect (e.g., a PCIe 6 interconnect), a memory interconnect (such as a DDR or GDDR memory interconnect), a compute express link (CXL) interconnect, a USB interconnect, a display interconnect, etc. In the illustrative embodiment, at least part of the high-speed signal traces 110 are directly below the voltage regulator 104 and not displaced to one side or the other. In other embodiments, some or all of a high-speed signal trace may be laterally displaced from directly below the voltage regulator 104, such as 1-8 laterally displaced millimeters. In some embodiments, the lateral displacement for high-speed signal traces 110 relative to the voltage regulator 104 may be referred to as a keep-out zone (KOZ) of the voltage regulator 104. It should be appreciated that the shielding of the partial metal vias 112 may allow the signal traces 110 to be closer to the voltage regulator 104 than they might otherwise be able to be (i.e., the keep-out zone may be smaller). As a result, the circuit board 102 may have a smaller form factor than it otherwise would without the partial metal vias 112. Additionally or alternatively, the circuit board 102 may have fewer layers than it otherwise would without the partial metal vias 112, as more of the circuit board 102 may be available to use to route high-speed signal traces 110.

Figure 4:
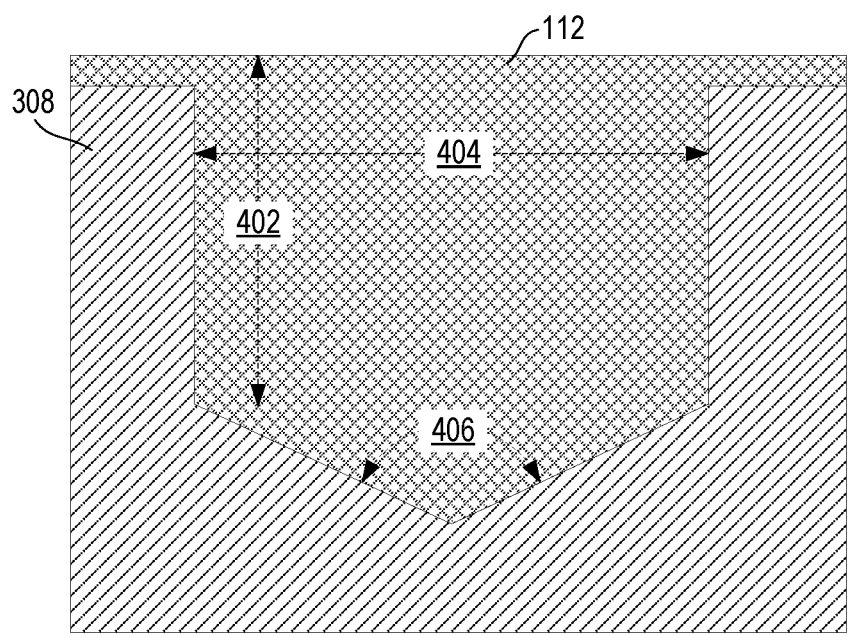
FIG. 4 is a zoomed-in cross-sectional view of a partial metal via of the system of FIG. 1.

Each partial metal via 112 may be any suitable width or thickness. A zoomed-in cross-sectional view of a partial metal via 112 is shown in FIG. 4. In the illustrative embodiment, the thickness 402 of each partial metal via 112 may extend, e.g., 10-90% of the thickness through the dielectric layer 308. In the illustrative embodiment, each partial metal via 112 extends about 60% of the way through the dielectric layer 308. For example, if the dielectric layer 308 has a thickness of 70 micrometers, each partial metal via 112 may have a thickness 402 of about 40 micrometers. In some embodiments, the thickness 402 of each partial metal via 112 may vary depending on a precision of manufacturing. For example, the thickness 402 of the partial metal vias 112 may vary by, e.g., 5-40 micrometers. Each partial metal via 112 may have any suitable width 404, such as 20-60 micrometers. In the illustrative embodiment, each of the metal vias 112 has a circular shape. In other embodiments, the metal vias 112 may have a different shape. In the illustrative embodiment, each partial metal via 112 has a conical bottom, as shown in FIG. 4. The angle 406 of the conical bottom may be any suitable angle, such as 90-180°. In the illustrative embodiment, the angle 406 is 130°.

Each partial metal via 112 may be spaced apart from the nearest partial metal vias 112 by any suitable amount, such as 20-500 micrometers. A layer, such as trace layer 306, may include any suitable partial metal vias 112, such as 50-5,000. In the illustrative embodiment, the partial metal vias 112 are arranged in a rectangular grid. In other embodiments, the partial metal vias 112 may be arranged in a different pattern, such as a hexagonal pattern.

The circuit board 102 may include several other traces or connections not shown in the figures, such as connections between various integrated circuit components such as a processor circuit, a memory circuit, a display circuit, power components, circuit components, etc. In some embodiments, the circuit board 102 may include one or more vias, connecting one trace layer to another. In some embodiments, the circuit board 102 may interface with, e.g., the processor 1100, system memory 1175, etc., processor 1270, memory 1232, etc., described below in regard to FIGS. 11 and 12.

Figure 5:
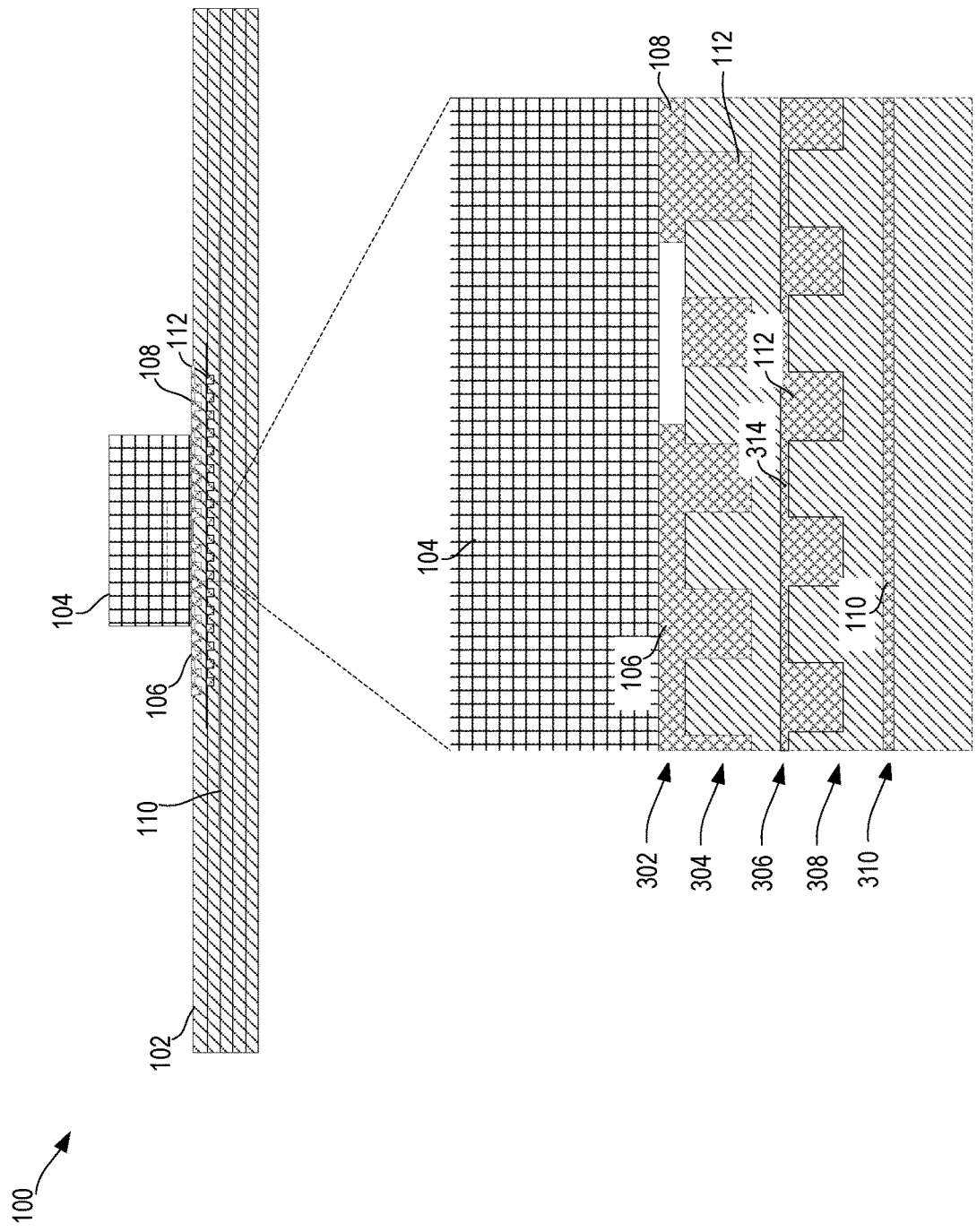
FIG. 5 is a cross-sectional view of one embodiment of a system with a circuit board with partial metal vias.

It should be appreciated that the partial metal vias 112 may be implemented in different embodiments beyond a single layer between a voltage regulator 104 and a signal trace 110. For example, as shown in FIG. 5, partial metal vias 112 may extend from the first power connector 106 and/or the second power connector 108, providing an additional layer of partial metal vias 112 to shield the signal traces 110. The circuit board 102 may have any suitable number of layers of partial metal vias 112 between a voltage regulator 104 and the signal traces 110, such as 1-10 layers of partial metal vias 112. In embodiments with more than one layer of partial metal vias 112, the different layers of partial metal vias 112 may be offset in any suitable direction, which can act to reduce or eliminate direct lines from the voltage regulator 104 to the signal traces 110 that do not pass through any partial metal via 112.

Figure 6:
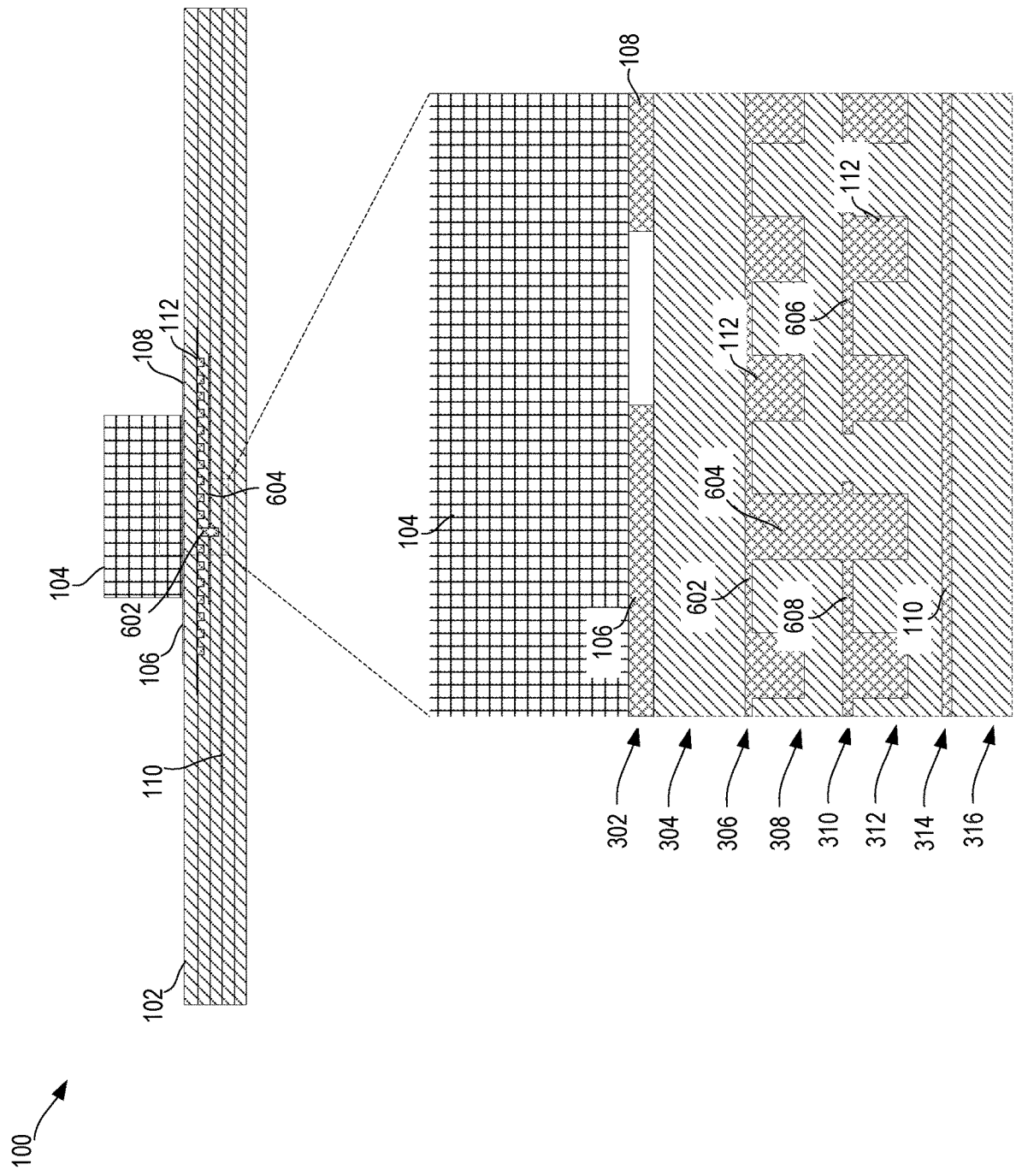
FIG. 6 is a cross-sectional view of one embodiment of a system with a circuit board with partial metal vias.

In another example, as shown in FIG. 6, a via 604 may extend from a first trace layer 306 to the next trace layer 310 as a standard via and then extend past the next trace layer 310 as a partial via. Such an approach can allow for vias connecting two trace layers that also include a partial metal via to increase the amount of conductive material blocking noise from the voltage regulator 104. It should be appreciated that, in embodiments with vias 604 connecting two trace layers, not all parts of the two trace layers need to be connected. For example, as shown in FIG. 6, trace 602 in trace layer 306 is connected to trace 608 in trace layer 310, but trace 602 is not connected to trace 606 that is also in trace layer 310.

Figure 7:
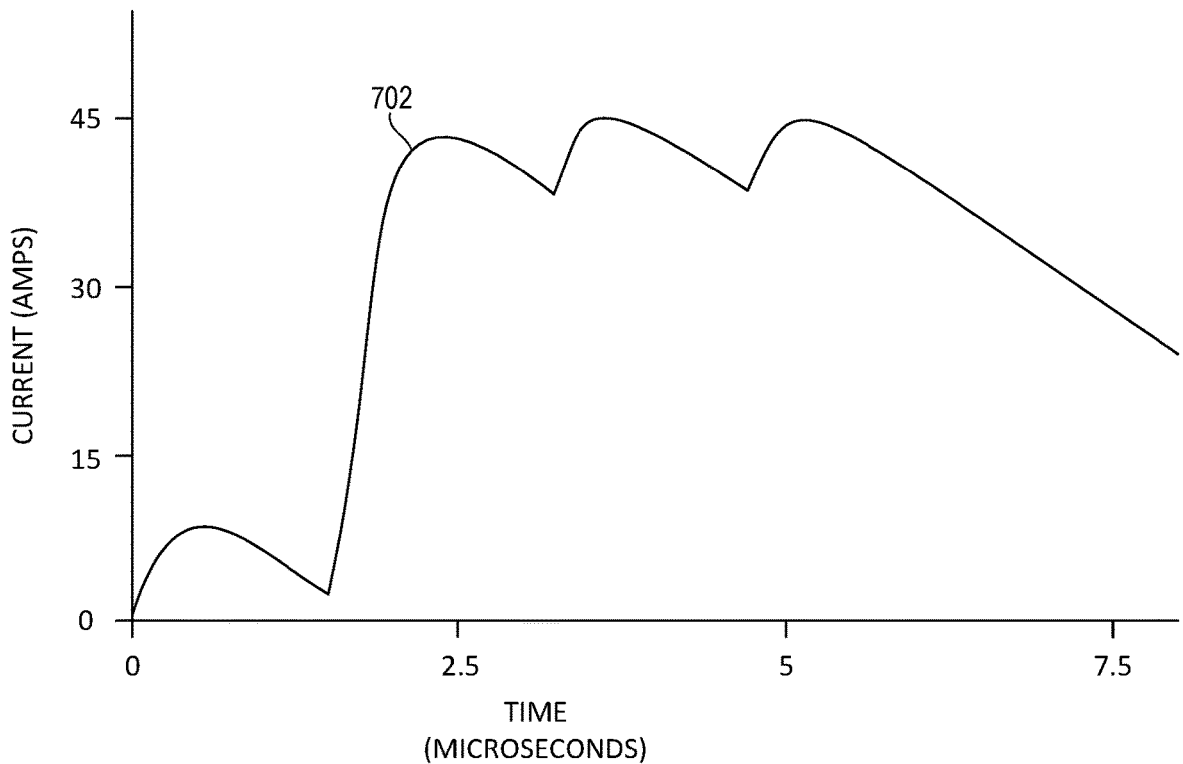
FIG. 7 is a graph showing current as a function of time through a voltage regulator in one embodiment.
Figure 8:
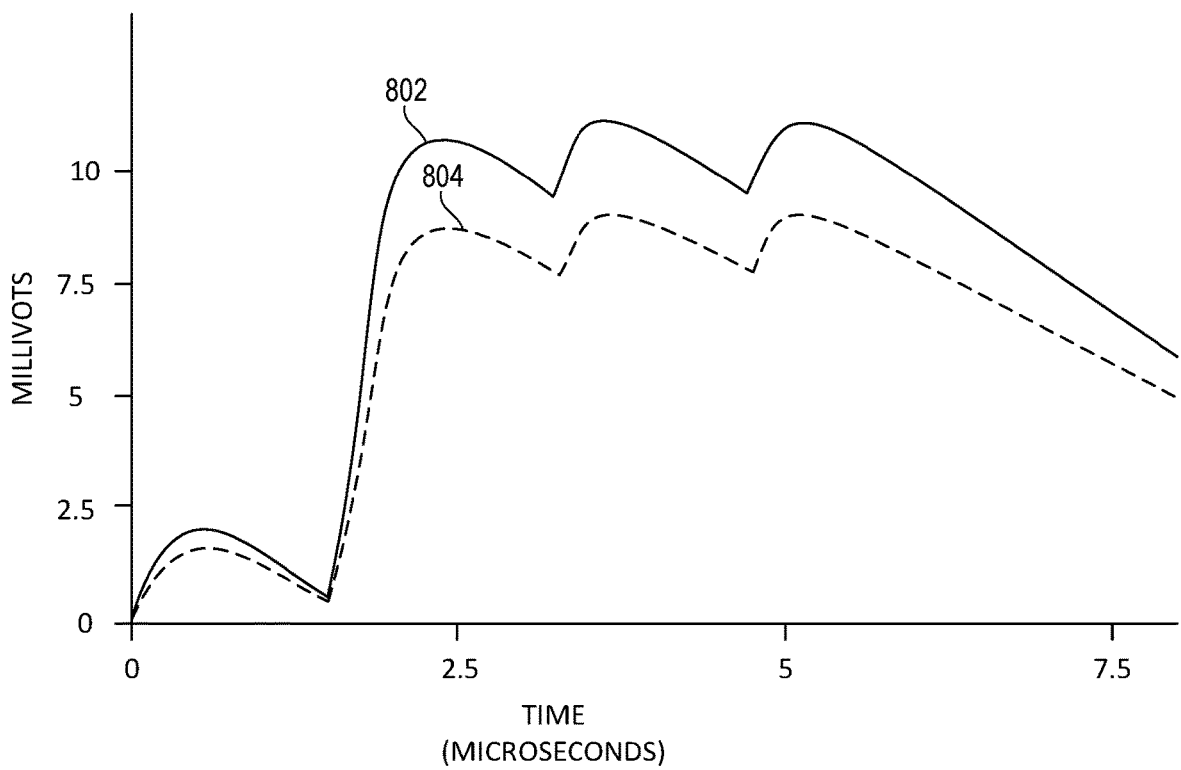
FIG. 8 is a graph showing voltage noise caused by a voltage regulator as a function of time.
Figure 9:
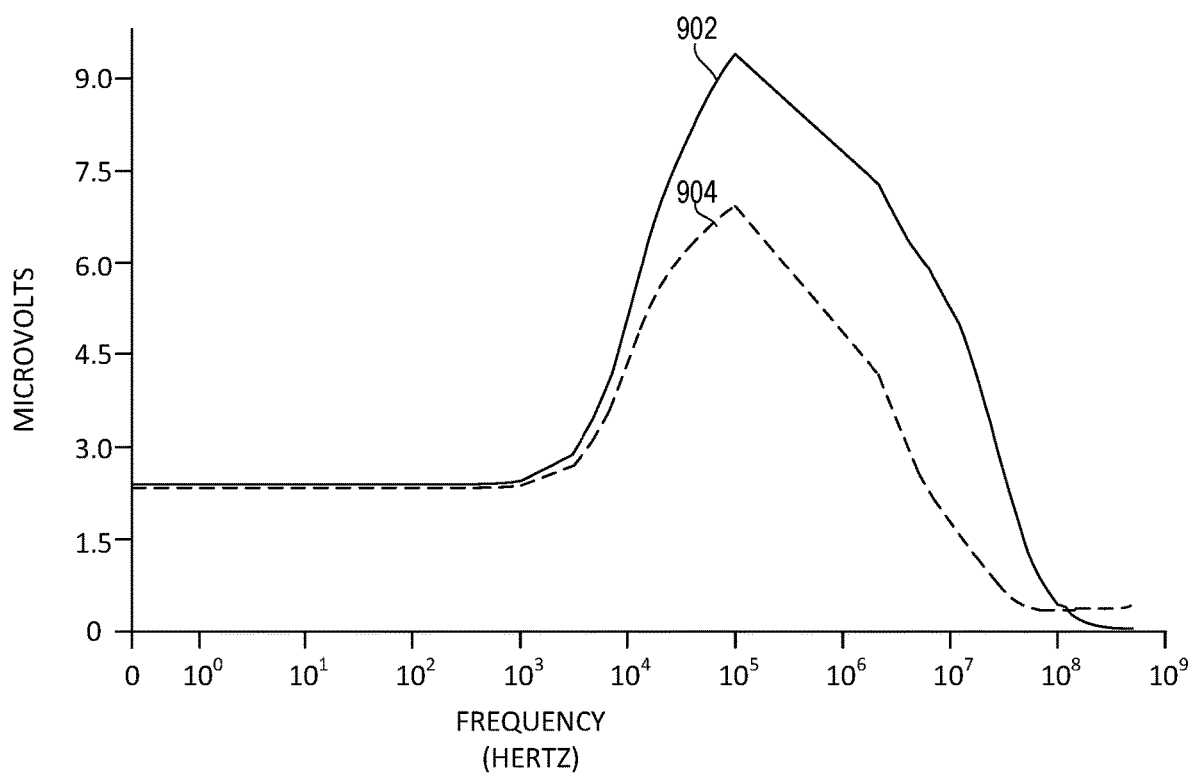
FIG. 9 is a graph showing voltage noise caused by a voltage regulator as a function of frequency.

Referring now to FIGS. 7-9, in one embodiment, graphs of various parameters are shown for different embodiments. In FIG. 7, a graph shows the current 702 through the voltage regulator 104 as a function of time. In FIG. 8, a graph shows the noise voltage 802 as a function of time for a signal trace 110 not shielded from the voltage regulator 104 with partial metal vias 112, and the graph shows the noise voltage 804 as a function of time for a signal trace 110 that is shielded from the voltage regulator 104 with a single layer of partial metal vias 112. In FIG. 9, a graph shows the noise voltage 902 and noise voltage 904 as a function of frequency for a signal trace 110 that is not shielded and is shielded, respectively, by a single layer of partial metal vias 112. The graph in FIG. 9 is based on a simulation with 50-ohm terminations in all ports of the system 100 and 10 milliamps of current through an inductor of the voltage regulator 104. The graphs in FIGS. 7 and 8 are based on 45 amps of current through an inductor of the voltage regulator 104. For the embodiment of 45 amps through an inductor of the voltage regulator 104, a single layer of partial metal vias 112 can reduce the noise by about 2.5 millivolts, or about 22%. It should be appreciated that the noise (and absolute amount of noise reduction) will increase for multiple inductors.

Figure 10:
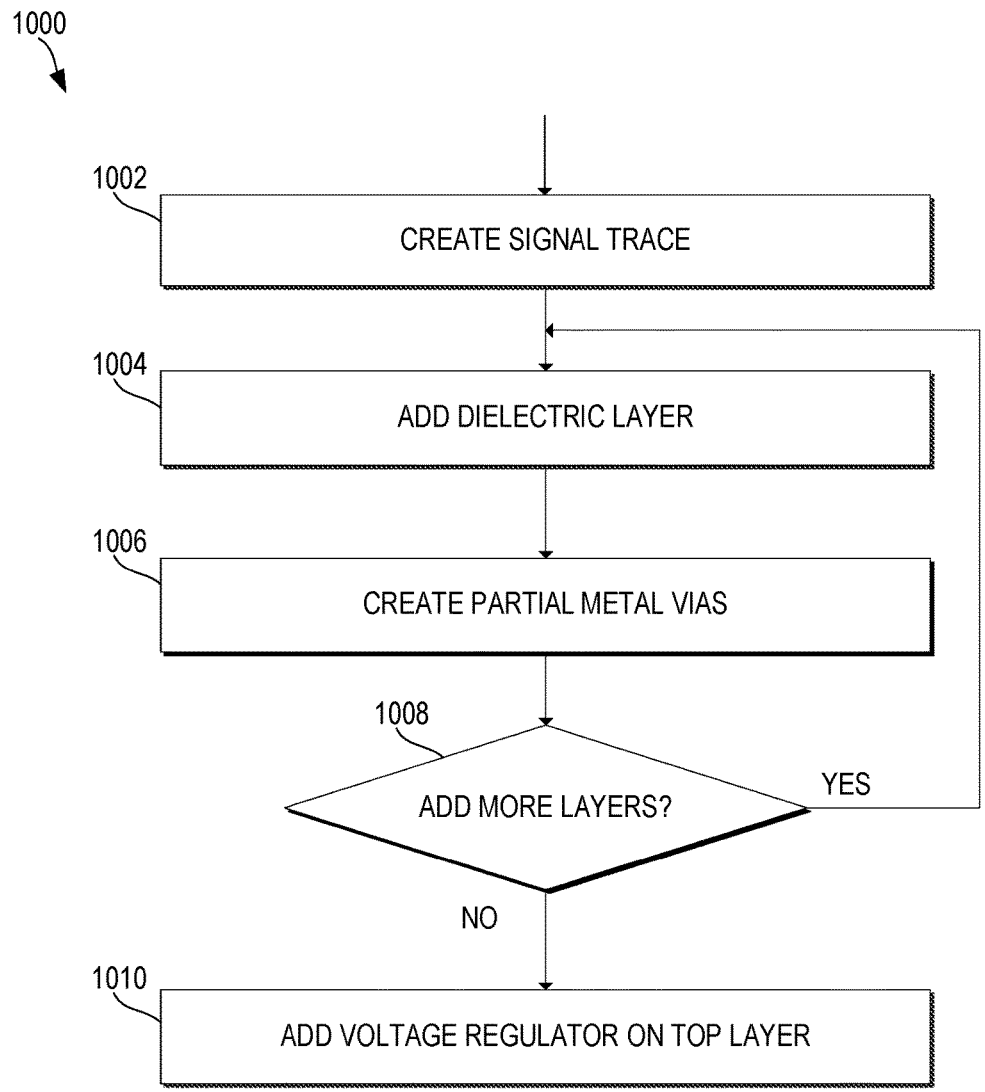
FIG. 10 is a simplified flow diagram of at least one embodiment of a method for manufacturing the system of FIG. 1.

Referring now to FIG. 10, in one embodiment, a flowchart for a method 1000 for creating the system 100 is shown. The method 1000 may be executed by a technician and/or by one or more automated machines. In some embodiments, one or more machines may be programmed to do some or all of the steps of the method 1000. Such a machine may include, e.g., a memory, a processor, data storage, etc. The memory and/or data storage may store instructions that, when executed by the machine, causes the machine to perform some or all of the steps of the method 1000. The method 1000 may use any suitable set of techniques that are used in semiconductor or printed circuit board processing, such as chemical vapor deposition, atomic layer deposition, physical layer deposition, molecular beam epitaxy, layer transfer, photolithography, ion implantation, dry etching, wet etching, thermal treatments, flip chip, layer transfer, magnetron sputter deposition, pulsed laser deposition, etc. It should be appreciated that the method 1000 is merely one embodiment of a method to create the system 100, and other methods may be used to create the system 100.

The method 1000 begins in block 1002, in which one or more signal traces 110 are created on a layer of a circuit board. The signal traces 110 may be deposited using, e.g., photolithography techniques. The signal traces 110 may be deposited on a layer of the circuit board 102, or the circuit board 102 may already have one or more layers before the signal traces 110 are deposited.

In block 1004, a dielectric layer is added over the signal traces 110. In the illustrative embodiment, a prepreg layer is added over the signal traces 110. In other embodiments, a dielectric layer may be added in a different manner.

In block 1006, partial metal vias 112 are created in the dielectric layer that was added. In the illustrative embodiment, partial metal vias 112 are made by mechanically drilling into the dielectric layer and then filling the hole with conductive material. In other embodiments, the hole for the partial metal vias 112 may be made using a laser drill, a chemical etch, or any other suitable technique. The hole may be filled using, e.g., electroless plating, electroplating, or any other suitable technique. Some or all of the partial metal vias 112 may be connected by forming traces on the dielectric layer.

In block 1008, if more layers are to be added to the circuit board 102, the method 1000 loops back to block 1004 to add an additional dielectric layer. If no more layers are to be added to the circuit board 102, the method 1000 proceeds to block 1010, in which a voltage regulator 104 is added on top of the circuit board 102. As part of adding the voltage regulator, the traces, such as the first power connector 106 and/or the second power connector 108 may be added before the voltage regulator 104 is placed on the circuit board 102. In some embodiments, the first power connector, second power connector 108, and/or other areas of the top layer of the circuit board 102 may have partial metal vias 112.

It should be appreciated that the method 1000 describes one simplified embodiment of a method 1000 for creating the system 100. In other embodiments, the method 1000 may create additional layers, may create additional traces, may include additional components, etc.

Figure 11:
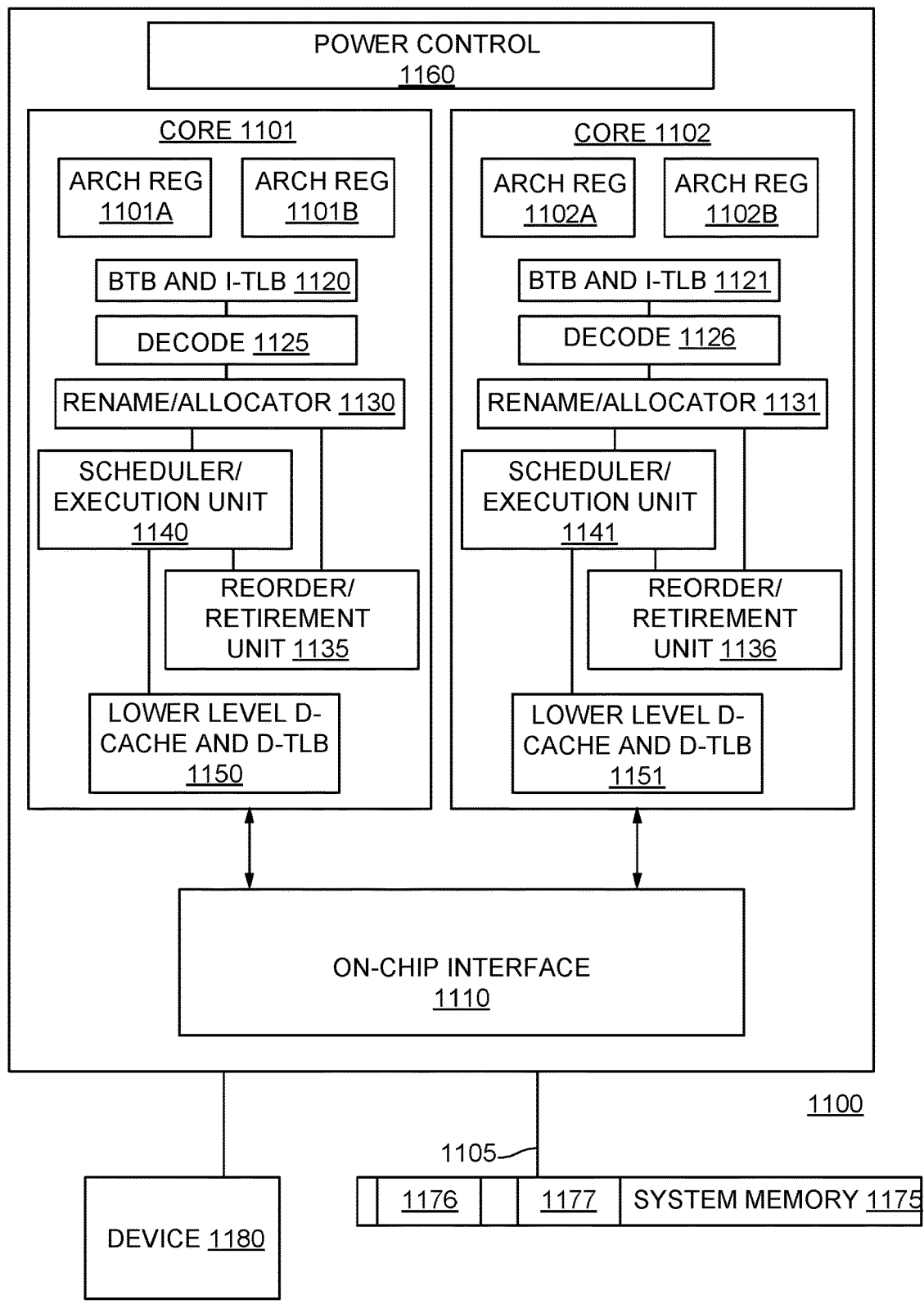
FIG. 11 illustrates an embodiment of a block diagram for a computing system including a multicore processor.

Referring to FIG. 11, an embodiment of a block diagram for a computing system including a multicore processor is depicted. Processor 1100 includes any processor or processing device, such as a microprocessor, an embedded processor, a digital signal processor (DSP), a network processor, a handheld processor, an application processor, a co-processor, a system on a chip (SOC), or other device to execute code. Processor 1100, in one embodiment, includes at least two cores—core 1101 and 1102, which may include asymmetric cores or symmetric cores (the illustrated embodiment). However, processor 1100 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1100, as illustrated in FIG. 11, includes two cores—core 1101 and 1102. Here, core 1101 and 1102 are considered symmetric cores, i.e. cores with the same configurations, functional units, and/or logic. In another embodiment, core 1101 includes an out-of-order processor core, while core 1102 includes an in-order processor core. However, cores 1101 and 1102 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such a binary translation, may be utilized to schedule or execute code on one or both cores. Yet to further the discussion, the functional units illustrated in core 1101 are described in further detail below, as the units in core 1102 operate in a similar manner in the depicted embodiment.

As depicted, core 1101 includes two hardware threads 1101a and 1101b, which may also be referred to as hardware thread slots 1101a and 1101b. Therefore, software entities, such as an operating system, in one embodiment potentially view processor 1100 as four separate processors, i.e., four logical processors or processing elements capable of executing four software threads concurrently. As alluded to above, a first thread is associated with architecture state registers 1101a, a second thread is associated with architecture state registers 1101b, a third thread may be associated with architecture state registers 1102a, and a fourth thread may be associated with architecture state registers 1102b. Here, each of the architecture state registers (1101a, 1101b, 1102a, and 1102b) may be referred to as processing elements, thread slots, or thread units, as described above. As illustrated, architecture state registers 1101a are replicated in architecture state registers 1101b, so individual architecture states/contexts are capable of being stored for logical processor 1101a and logical processor 1101b. In core 1101, other smaller resources, such as instruction pointers and renaming logic in allocator and renamer block 1130 may also be replicated for threads 1101a and 1101b. Some resources, such as re-order buffers in reorder/retirement unit 1135, ILTB 1120, load/store buffers, and queues may be shared through partitioning. Other resources, such as general purpose internal registers, page-table base register(s), low-level data-cache and data-TLB 1115, execution unit(s) 1140, and portions of out-of-order unit 1135 are potentially fully shared.

Processor 1100 often includes other resources, which may be fully shared, shared through partitioning, or dedicated by/to processing elements. In FIG. 11, an embodiment of a purely exemplary processor with illustrative logical units/resources of a processor is illustrated. Note that a processor may include, or omit, any of these functional units, as well as include any other known functional units, logic, or firmware not depicted. As illustrated, core 1101 includes a simplified, representative out-of-order (OOO) processor core. But an in-order processor may be utilized in different embodiments. The OOO core includes a branch target buffer 1120 to predict branches to be executed/taken and an instruction-translation buffer (I-TLB) 1120 to store address translation entries for instructions.

Core 1101 further includes decode module 1125 coupled to fetch unit 1120 to decode fetched elements. Fetch logic, in one embodiment, includes individual sequencers associated with thread slots 1101a, 1101b, respectively. Usually core 1101 is associated with a first ISA, which defines/specifies instructions executable on processor 1100. Often machine code instructions that are part of the first ISA include a portion of the instruction (referred to as an opcode), which references/specifies an instruction or operation to be performed. Decode logic 1125 includes circuitry that recognizes these instructions from their opcodes and passes the decoded instructions on in the pipeline for processing as defined by the first ISA. For example, as discussed in more detail below decoders 1125, in one embodiment, include logic designed or adapted to recognize specific instructions, such as transactional instruction. As a result of the recognition by decoders 1125, the architecture or core 1101 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1126, in one embodiment, recognize the same ISA (or a subset thereof). Alternatively, in a heterogeneous core environment, decoders 1126 recognize a second ISA (either a subset of the first ISA or a distinct ISA).

In one example, allocator and renamer block 1130 includes an allocator to reserve resources, such as register files to store instruction processing results. However, threads 1101a and 1101b are potentially capable of out-of-order execution, where allocator and renamer block 1130 also reserves other resources, such as reorder buffers to track instruction results. Unit 1130 may also include a register renamer to rename program/instruction reference registers to other registers internal to processor 1100. Reorder/retirement unit 1135 includes components, such as the reorder buffers mentioned above, load buffers, and store buffers, to support out-of-order execution and later in-order retirement of instructions executed out-of-order.

Scheduler and execution unit(s) block 1140, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1150 are coupled to execution unit(s) 1140. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1101 and 1102 share access to higher-level or further-out cache, such as a second level cache associated with on-chip interface 1110. Note that higher-level or further-out refers to cache levels increasing or getting further way from the execution unit(s). In one embodiment, higher-level cache is a last-level data cache—last cache in the memory hierarchy on processor 1100—such as a second or third level data cache. However, higher level cache is not so limited, as it may be associated with or include an instruction cache. A trace cache—a type of instruction cache—instead may be coupled after decoder 1125 to store recently decoded traces. Here, an instruction potentially refers to a macro-instruction (i.e. a general instruction recognized by the decoders), which may decode into a number of micro-instructions (micro-operations).

In the depicted configuration, processor 1100 also includes on-chip interface module 1110. Historically, a memory controller, which is described in more detail below, has been included in a computing system external to processor 1100. In this scenario, on-chip interface 1110 is to communicate with devices external to processor 1100, such as system memory 1175, a chipset (often including a memory controller hub to connect to memory 1175 and an I/O controller hub to connect peripheral devices), a memory controller hub, a northbridge, or other integrated circuit. And in this scenario, bus 1105 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1175 may be dedicated to processor 1100 or shared with other devices in a system. Common examples of types of memory 1175 include DRAM, SRAM, non-volatile memory (NV memory), and other known storage devices. Note that device 1180 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1100. For example in one embodiment, a memory controller hub is on the same package and/or die with processor 1100. Here, a portion of the core (an on-core portion) 1110 includes one or more controller(s) for interfacing with other devices such as memory 1175 or a graphics device 1180. The configuration including an interconnect and controllers for interfacing with such devices is often referred to as an on-core (or un-core configuration). As an example, on-chip interface 1110 includes a ring interconnect for on-chip communication and a high-speed serial point-to-point link 1105 for off-chip communication. Yet, in the SOC environment, even more devices, such as the network interface, co-processors, memory 1175, graphics processor 1180, and any other known computer devices/interface may be integrated on a single die or integrated circuit to provide small form factor with high functionality and low power consumption.

In one embodiment, processor 1100 is capable of executing a compiler, optimization, and/or translator code 1177 to compile, translate, and/or optimize application code 1176 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 12:
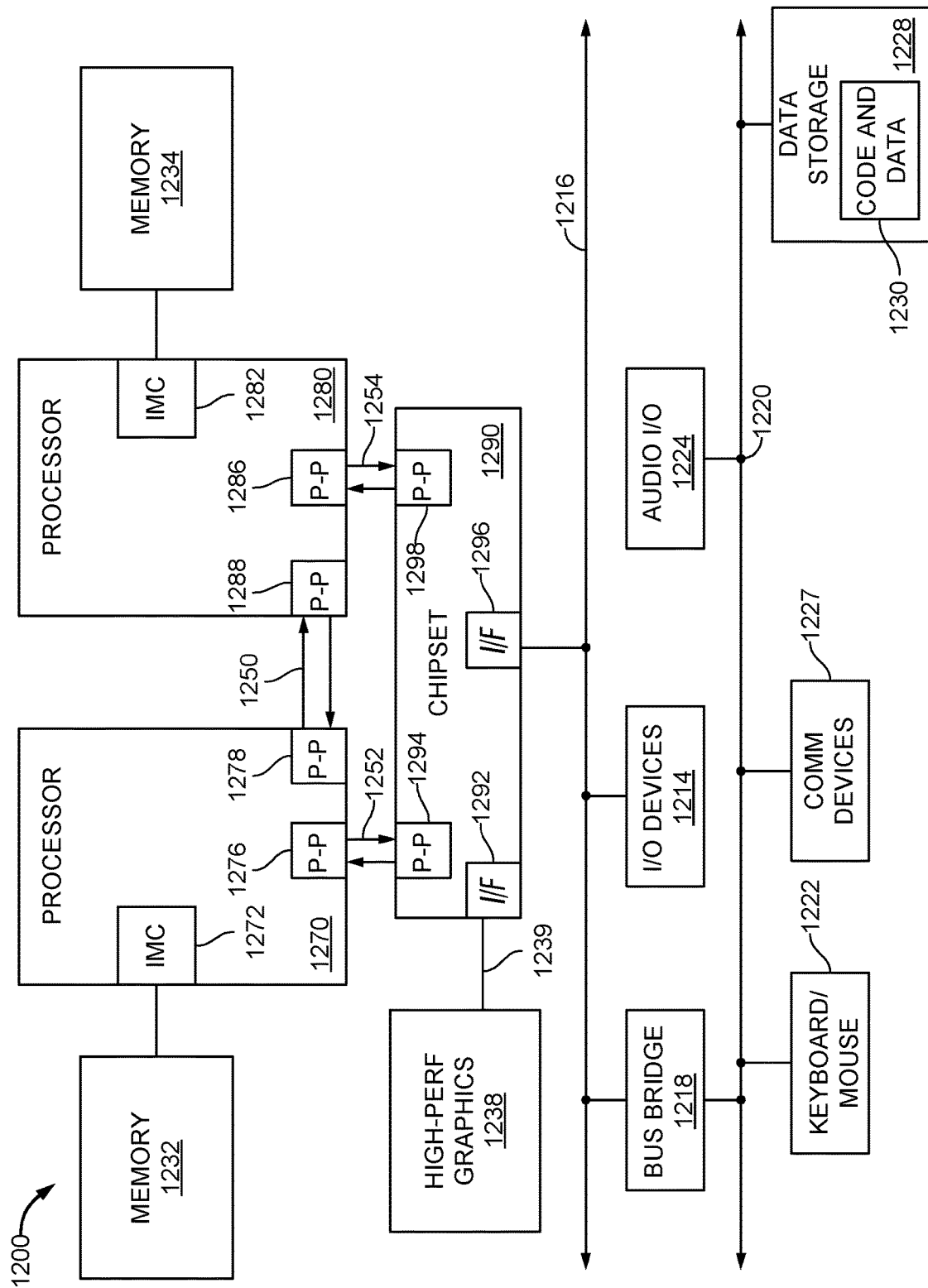
FIG. 12 illustrates an embodiment of a block for a computing system including multiple processors.

Referring now to FIG. 12, shown is a block diagram of another system 1200 in accordance with an embodiment of the present disclosure. As shown in FIG. 12, multiprocessor system 1200 is a point-to-point interconnect system, and includes a first processor 1270 and a second processor 1280 coupled via a point-to-point interconnect 1250. Each of processors 1270 and 1280 may be some version of a processor. In one embodiment, 1252 and 1254 are part of a serial, point-to-point coherent interconnect fabric, such as a high-performance architecture. As a result, aspects of the present disclosure may be implemented within the QPI architecture.

While shown with only two processors 1270, 1280, it is to be understood that the scope of the present disclosure is not so limited. In other embodiments, one or more additional processors may be present in a given processor.

Processors 1270 and 1280 are shown including integrated memory controller units 1272 and 1282, respectively. Processor 1270 also includes as part of its bus controller units point-to-point (P-P) interfaces 1276 and 1278; similarly, second processor 1280 includes P-P interfaces 1286 and 1288. Processors 1270, 1280 may exchange information via a point-to-point (P-P) interface 1250 using P-P interface circuits 1278, 1288. As shown in FIG. 12, IMCs 1272 and 1282 couple the processors to respective memories, namely a memory 1232 and a memory 1234, which may be portions of main memory locally attached to the respective processors.

Processors 1270, 1280 each exchange information with a chipset 1290 via individual P-P interfaces 1252, 1254 using point to point interface circuits 1276, 1294, 1286, 1298. Chipset 1290 also exchanges information with a high-performance graphics circuit 1238 via an interface circuit 1292 along a high-performance graphics interconnect 1239.

A shared cache (not shown) may be included in either processor or outside of both processors; yet connected with the processors via P-P interconnect, such that either or both processors' local cache information may be stored in the shared cache if a processor is placed into a low power mode.

Chipset 1290 may be coupled to a first bus 1216 via an interface 1296. In one embodiment, first bus 1216 may be a Peripheral Component Interconnect (PCI) bus, or a bus such as a PCI Express bus or another third generation I/O interconnect bus, although the scope of the present disclosure is not so limited.

As shown in FIG. 12, various I/O devices 1214 are coupled to first bus 1216, along with a bus bridge 1218 which couples first bus 1216 to a second bus 1220. In one embodiment, second bus 1220 includes a low pin count (LPC) bus. Various devices are coupled to second bus 1220 including, for example, a keyboard and/or mouse 1222, communication devices 1227 and a storage unit 1228 such as a disk drive or other mass storage device which often includes instructions/code and data 1230, in one embodiment. Further, an audio I/O 1224 is shown coupled to second bus 1220. Note that other architectures are possible, where the included components and interconnect architectures vary. For example, instead of the point-to-point architecture of FIG. 12, a system may implement a multi-drop bus or other such architecture.

It should be appreciated that, in some embodiments, a circuit board with a power tunnel may connect some or all of the various components shown in FIG. 12. Such a circuit board may include one or more power tunnels to carry current to and from any suitable component, such as the memory 1232, the processor 1270, the high-performance graphics 1238, etc.

While aspects of the present disclosure have been described with respect to a limited number of embodiments, those skilled in the art will appreciate numerous modifications and variations therefrom. It is intended that the appended claims cover all such modifications and variations as fall within the true spirit and scope of this present disclosure.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the present disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

EXAMPLES

Illustrative examples of the technologies disclosed herein are provided below. An embodiment of the technologies may include any one or more, and any combination of, the examples described below.

Example 1 includes a circuit board comprising one or more traces on a first trace layer of the circuit board; one or more traces on a second trace layer of the circuit board; a dielectric layer between the first trace layer and the second trace layer, the dielectric layer in contact with the one or more traces on the first trace layer and the one or more traces on the second trace layer; and a plurality of partial vias extending from the first trace layer, into the dielectric layer, and towards the second trace layer, wherein individual partial vias of the plurality of partial vias do not extend to the second trace layer.

Example 2 includes the subject matter of Example 1, and wherein a voltage regulator is mounted on a top surface of the circuit board, wherein the plurality of partial vias are positioned below the voltage regulator.

Example 3 includes the subject matter of any of Examples 1 and 2, and further including a high-speed signal trace in the circuit board, the high-speed signal trace positioned below the voltage regulator and the plurality of partial vias.

Example 4 includes the subject matter of any of Examples 1-3, and wherein the high-speed signal trace is part of a peripheral component interconnect express (PCIe) interconnect.

Example 5 includes the subject matter of any of Examples 1-4, and further including a first power connector on the top surface of the circuit board, the first power connector connected to the voltage regulator; a second power connector on the top surface of the circuit board, the second power connector connected to the voltage regulator; and a second plurality of partial vias, each of the second plurality of partial vias extending from the first power connector or the second power connector into a second dielectric layer, wherein individual partial vias of the second plurality of partial vias do not extend completely through the second dielectric layer.

Example 6 includes the subject matter of any of Examples 1-5, and wherein the voltage regulator is configured to have an input current of at least 25 amps.

Example 7 includes the subject matter of any of Examples 1-6, and further including one or more traces on a third trace layer of the circuit board; a second dielectric layer between the second trace layer and the third trace layer, the dielectric layer in contact with the one or more traces on the second trace layer and the one or more traces on the third trace layer; and a second plurality of partial vias extending from the second trace layer, into the second dielectric layer, and towards the third trace layer, wherein individual partial vias of the plurality of partial vias do not extend to the third trace layer.

Example 8 includes the subject matter of any of Examples 1-7, and wherein the second plurality of partial vias are offset relative to the plurality of partial vias.

Example 9 includes the subject matter of any of Examples 1-8, and further including a via extending from the first trace layer, through the dielectric layer, through the second trace layer, and at least partially through the second dielectric layer towards the third trace layer, wherein the via does not extend to the third trace layer.

Example 10 includes the subject matter of any of Examples 1-9, and wherein the one or more traces of the first trace layer are of a first ground net, and wherein the one or more traces of the second trace layer are of a second ground net different from the first ground net.

Example 11 includes the subject matter of any of Examples 1-10, and wherein each of the plurality of partial vias extends at least halfway through the dielectric layer.

Example 12 includes the subject matter of any of Examples 1-11, and wherein each of the plurality of partial vias is copper.

Example 13 includes a system comprising the circuit board of claim 1, further comprising a processor; a memory; and a display.

Example 14 includes a system comprising a circuit board; a voltage regulator on a top surface of the circuit board; a plurality of partial metal vias defined in the circuit board, the plurality of partial metal vias below the voltage regulator; and one or more high-speed signal traces below the voltage regulator and the plurality of partial metal vias.

Example 15 includes the subject matter of Example 14, and further including a first power connector on the top surface of the circuit board, the first power connector connected to the voltage regulator; a second power connector on the top surface of the circuit board, the second power connector connected to the voltage regulator; and a second plurality of partial metal vias, each of the second plurality of partial metal vias extending from the first power connector or the second power connector towards the plurality of partial metal vias.

Example 16 includes the subject matter of any of Examples 14 and 15, and wherein the one or more high-speed signal traces are part of a peripheral component interconnect express (PCIe) interconnect.

Example 17 includes the subject matter of any of Examples 14-16, and wherein the voltage regulator is configured to have an input current of at least 25 amps.

Example 18 includes the subject matter of any of Examples 14-17, and further including a second plurality of partial metal vias defined in the circuit board, the second plurality of partial metal vias below the plurality of partial metal vias and above the one or more high-speed signal traces.

Example 19 includes the subject matter of any of Examples 14-18, and wherein the second plurality of partial metal vias are offset relative to the plurality of partial metal vias.

Example 20 includes the subject matter of any of Examples 14-19, and wherein each of the plurality of partial metal vias extends at least halfway through a dielectric layer.

Example 21 includes the subject matter of any of Examples 14-20, and wherein each of the plurality of partial metal vias is copper.

Example 22 includes the subject matter of any of Examples 14-21, and further including a processor; a memory; and a display.

Example 23 includes a method of creating a circuit board, the method comprising creating a signal trace on a first dielectric layer of the circuit board; adding a second dielectric layer above the first dielectric layer; creating a plurality of partial metal vias in the second dielectric layer; and adding a third dielectric layer above the second dielectric layer; and adding a voltage regulator on the third dielectric layer, wherein the voltage regulator is above the plurality of partial metal vias and above the signal trace.

Example 24 includes the subject matter of Example 23, and wherein creating the plurality of partial metal vias comprises mechanically drilling a plurality of holes from the second dielectric layer towards the first dielectric layer, wherein each of the plurality of holes does not extend completely through the second dielectric layer; and plating each of the plurality of holes with copper.

Example 25 includes the subject matter of any of Examples 23 and 24, and further including creating a first power connector on the third dielectric layer, the first power connector connected to the voltage regulator; creating a second power connector on the third dielectric layer, the second power connector connected to the voltage regulator; and creating a second plurality of partial metal vias, each of the second plurality of partial metal vias extending from the first power connector or the second power connector towards the plurality of partial metal vias.

Example 26 includes the subject matter of any of Examples 23-25, and wherein the signal trace is part of a peripheral component interconnect express (PCIe) interconnect.

Example 27 includes the subject matter of any of Examples 23-26, and wherein the voltage regulator is configured to have an input current of at least 25 amps.

Example 28 includes the subject matter of any of Examples 23-27, and further including creating a second plurality of partial metal vias in the circuit board, the second plurality of partial metal vias below the voltage regulator and above the plurality of partial metal vias.

Example 29 includes the subject matter of any of Examples 23-28, and wherein the second plurality of partial metal vias are offset relative to the plurality of partial metal vias.

Example 30 includes the subject matter of any of Examples 23-29, and wherein each of the plurality of partial metal vias extends at least halfway through the second dielectric layer.

Example 31 includes a system comprising means for performing the method of any of Examples 23-30.

The invention claimed is:

1. A circuit board comprising:
one or more traces on a first trace layer of the circuit board;
one or more traces on a second trace layer of the circuit board;
a dielectric layer between the first trace layer and the second trace layer, the dielectric layer in contact with the one or more traces on the first trace layer and the one or more traces on the second trace layer; and
a plurality of partial vias extending from the first trace layer, into the dielectric layer, and towards the second trace layer, wherein individual partial vias of the plurality of partial vias do not extend to the second trace layer, wherein the plurality of partial vias are electrically isolated from one or more traces on the second trace layer immediately below the plurality of partial vias, wherein a voltage regulator is mounted on a top surface of the circuit board, wherein the plurality of partial vias are positioned below the voltage regulator, further comprising:
- a first power connector on the top surface of the circuit board, the first power connector connected to the voltage regulator;
- a second power connector on the top surface of the circuit board, the second power connector connected to the voltage regulator; and
- a second plurality of partial vias, each of the second plurality of partial vias extending from the first power connector or the second power connector into a second dielectric layer, wherein individual partial vias of the second plurality of partial vias do not extend completely through the second dielectric layer.

2. The circuit board of claim 1, further comprising a high-speed signal trace in the circuit board, the high-speed signal trace positioned below the voltage regulator and the plurality of partial vias.

3. The circuit board of claim 2, wherein the high-speed signal trace is part of a peripheral component interconnect express (PCIe) interconnect.

4. The circuit board of claim 1, wherein the voltage regulator is configured to have an input current of at least 25 amps.

5. The circuit board of claim 1, wherein the one or more traces of the first trace layer are of a first ground net, and wherein the one or more traces of the second trace layer are of a second ground net different from the first ground net.

6. The circuit board of claim 1, wherein each of the plurality of partial vias is copper.

7. A system comprising the circuit board of claim 1, further comprising:
- a processor;
- a memory; and
- a display.

8. The circuit board of claim 2, wherein the high-speed signal trace is positioned on the second trace layer below the voltage regulator and the plurality of partial vias.

9. A system comprising:
- a circuit board;
- a voltage regulator on a top surface of the circuit board;
- a plurality of partial metal vias defined in the circuit board, the plurality of partial metal vias below the voltage regulator;
- one or more high-speed signal traces below the voltage regulator and the plurality of partial metal vias, and
- a second plurality of partial metal vias defined in the circuit board, the second plurality of partial metal vias below the plurality of partial metal vias and above the one or more high-speed signal traces.

10. The system of claim 9, wherein the second plurality of partial metal vias are offset relative to the plurality of partial metal vias.

11. The system of claim 9, wherein the plurality of partial metal vias extend partway into a dielectric layer, wherein the one or more high-speed signal traces below the plurality of partial metal vias are defined in a trace layer immediately below the dielectric layer.

12. A method of creating a circuit board, the method comprising:
- creating a high-speed signal trace on a first dielectric layer of the circuit board;
- adding a second dielectric layer above the first dielectric layer;
- creating a plurality of partial metal vias in the second dielectric layer;
- adding a third dielectric layer above the second dielectric layer;
- adding a voltage regulator on the third dielectric layer, wherein the voltage regulator is above the plurality of partial metal vias and above the signal trace;
- creating a first power connector on the third dielectric layer, the first power connector connected to the voltage regulator;
- creating a second power connector on the third dielectric layer, the second power connector connected to the voltage regulator; and
- creating a second plurality of partial metal vias, each of the second plurality of partial metal vias extending from the first power connector or the second power connector towards the plurality of partial metal vias.

13. The method of claim 12, wherein the second plurality of partial metal vias are offset relative to the plurality of partial metal vias.

* * * * *